(12) United States Patent
Chun

(10) Patent No.: US 8,305,833 B2
(45) Date of Patent: *Nov. 6, 2012

(54) MEMORY CHIP ARCHITECTURE HAVING NON-RECTANGULAR MEMORY BANKS AND METHOD FOR ARRANGING MEMORY BANKS

(75) Inventor: Jun-Hyun Chun, Kyoungki-do (KR)

(73) Assignee: 658868 N.B. Inc., St. John, New Brunswick (CA)

( * ) Notice: Subject to any disclaimer, the term of this patent is extended or adjusted under 35 U.S.C. 154(b) by 141 days.

This patent is subject to a terminal disclaimer.

(21) Appl. No.: 11/809,244

(22) Filed: May 30, 2007

(65) Prior Publication Data

US 2008/0002508 A1 Jan. 3, 2008

Related U.S. Application Data

(63) Continuation of application No. 10/511,253, filed as application No. PCT/KR03/00722 on Apr. 10, 2003, now Pat. No. 7,236,420.

(30) Foreign Application Priority Data

| Apr. 10, 2002 | (KR) | ................................. 2002-19394 |
| Apr. 10, 2002 | (KR) | ................................. 2002-19395 |
| Apr. 10, 2002 | (KR) | ................................. 2002-19444 |
| Mar. 24, 2003 | (KR) | ................................. 2003-18104 |

(51) Int. Cl.
*G11C 8/00* (2006.01)
(52) U.S. Cl. ..................................... 365/230.03; 365/63
(58) Field of Classification Search ............. 365/230.03, 365/132, 51; 711/5, 117, 170–173, 201, 711/209; 257/206, 401, E27.013, E29.026, 257/E23.07

See application file for complete search history.

(56) References Cited

U.S. PATENT DOCUMENTS

| 5,781,495 | A   |   | 7/1998  | Arimoto                  |
| 5,880,987 | A   |   | 3/1999  | Merritt                  |
| 5,970,002 | A   | * | 10/1999 | Yoo .............................. 365/200 |
| 5,999,480 | A   | * | 12/1999 | Ong et al. ................. 365/230.06 |
| 6,064,618 | A   | * | 5/2000  | Kuriyama et al. ........ 365/230.03 |
| 6,121,677 | A   |   | 9/2000  | Song et al.              |
| 6,151,269 | A   | * | 11/2000 | Dosaka et al. ............ 365/189.17 |
| 6,320,779 | B1  |   | 11/2001 | Morgan et al.            |
| 6,741,488 | B1  | * | 5/2004  | Heightley et al. ............... 365/63 |
| 7,236,420 | B2  | * | 6/2007  | Chun ........................ 365/230.03 |
| 2003/0076702 | A1 | * | 4/2003 | Kyung et al. .................... 365/51 |

FOREIGN PATENT DOCUMENTS

| CN | 1284725      | 2/2001 |
| JP | 09-074171    | 3/1997 |
| JP | 10-050958    | 2/1998 |
| JP | 11-145420    | 5/1999 |
| JP | 11-203862    | 7/1999 |
| JP | 11-265573    | 9/1999 |
| JP | 2000-228501  | 8/2000 |
| KR | 1999-40435   | 6/1999 |
| KR | 1999-41456   | 6/1999 |
| TW | 358939       | 5/1999 |
| TW | 389907       | 5/2000 |
| TW | 427529       | 3/2001 |
| TW | 453498       | 9/2001 |
| TW | 481786       | 4/2002 |

* cited by examiner

*Primary Examiner* — Allison P Bernstein

(57) ABSTRACT

A semiconductor memory device having semiconductor memory chips, each semiconductor memory chip includes a plurality of memory banks capable of independently to be accessed, each memory bank having a plurality of memory blocks, wherein at least two memory blocks, which are neighbored each other in the same memory bank, have the different number of unit memory blocks, so that each bank has a non-rectangular shape.

10 Claims, 16 Drawing Sheets

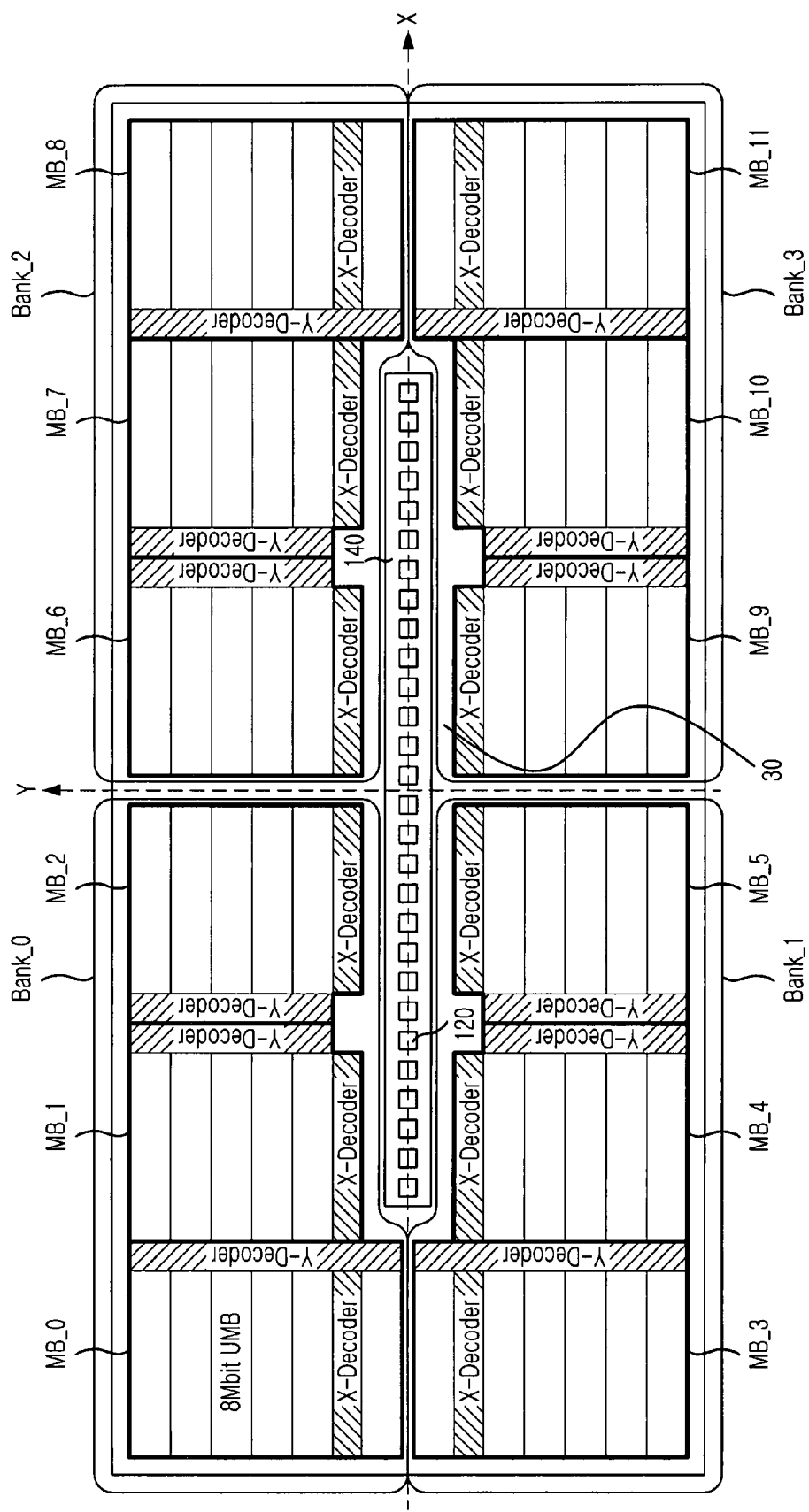

_US 8,305,833 B2_

MEMORY CHIP ARCHITECTURE HAVING NON-RECTANGULAR MEMORY BANKS AND METHOD FOR ARRANGING MEMORY BANKS

The present patent application is a Continuation of application Ser. No. 10/511,253, filed Apr. 25, 2005 now U.S. Pat. No. 7,236,420, which is a non-provisional application of International Application No. PCT/KR03/00722, filed Apr. 10, 2003.

FIELD OF THE INVENTION

The present invention relates to a semiconductor memory device; and, more particularly, to a semiconductor memory chip architecture of memory banks, each having a plurality of memory blocks, and pads/control blocks and a method for arranging the memory blocks on the memory bank in a semiconductor memory device in a space effective manner.

DESCRIPTION OF RELATED ART

As well known, a semiconductor memory device is generally provided with a semiconductor memory chip and a package. The semiconductor memory chip has a plurality of memory banks, each memory bank to be independently accessed. Typically, the memory device consists of, e.g., four memory banks and each memory bank consists of, e.g., four memory blocks. Each memory block includes a plurality of memory cells arranged in a matrix and selected by the same X-decoder and Y-decoder.

FIG. 1 is a plane view showing a typical memory bank in the semiconductor memory chip. For example, a 256-Mbit semiconductor memory chip is illustrated.

As shown, the semiconductor memory chip includes 16 memory blocks MBs, each having a square or a rectangular shape, and four memory blocks are assigned as one memory bank Bank_0, Bank_1, Bank_2 or Bank_3. Each of the memory banks Bank_0, Bank_1, Bank_2 or Bank_3 is also structured with a rectangular shape. Each memory block MB consists of a plurality of unit cells corresponding to 16 Mbits. The unit cells are grouped as four unit memory blocks UMBs and each unit memory block UMB corresponds to 4-Mbit memory block. Each memory block includes an X-decoder along an X-axis and a Y-decoder along a Y-axis so as to select one of memory cells.

A plurality of pads 12 and a control block 14 should be disposed in the semiconductor memory chip area except the memory blocks. The pads 12 and the control block 14 are disposed along the X-axis in the center of the semiconductor memory chip 10 according to the prior art as shown in FIG. 1. As well known, the pads are employed for transferring signals to external circuits of the semiconductor memory chip 10 and the control block 14 controls data input/output from the memory cells in response to a control signal applied from an external circuit.

FIG. 2 is a schematic plane view showing a relationship between a semiconductor memory chip having an increased size and a conventional package.

A reference numeral 20 represents the conventional package which, for example, is used in implementation of 256-Mbit semiconductor memory device. A reference numeral 22 represents a memory bank array of 512-Mbit semiconductor memory chip designed by using the same design rule used in the 256-Mbit.

As shown, for example, the 512-Mbit semiconductor memory chip having 16 memory blocks MBs are arranged in the conventional package with the same design rule according to the standard package rule of the joint electron device engineering council (JEDEC). However, as the storage capacity of semiconductor memory chip is increased, e.g., from 256 Mbits to 512 Mbits, the semiconductor memory chip size is significantly increased under the same design rule. As a result, the size-increased 16 memory blocks of 512-Mbit semiconductor memory chip cannot be arranged in the conventional package as shown in FIG. 2. Accordingly, in order to arrange the semiconductor memory chip in the same package, a design rule of a higher technology should be applied. However, higher cost and time are required in order to develop such a higher technology design rule, so that there is a problem that a memory manufacturer cannot properly and timely supply a semiconductor memory chip having a more increased storage capacity to the required system.

Furthermore, when the semiconductor memory chip has a square shape, that is, a ratio of horizontal length to vertical length in the chip becomes 1:1, the numbers of semiconductor memory chips to be obtained from a wafer are maximized. However, if, as shown in FIG. 2, the semiconductor memory chip is formed in such a manner that the ratio of horizontal length to vertical length in the semiconductor memory chip becomes larger, the numbers of chips to be obtained from the wafer may be significantly decreased.

SUMMARY OF THE INVENTION

It is, therefore, an object of the present invention to provide a semiconductor memory device capable of highly integrating memory chip without developing a high technology in accordance with the present invention.

In accordance with an aspect of the present invention, there is provided a semiconductor memory device having semiconductor memory chips, each semiconductor memory chip comprising: a plurality of memory banks to be independently accessed, each memory bank having a plurality of memory blocks, wherein at least two memory blocks, which are neighbored each other in the same memory bank, have the different number of unit memory blocks, so that each bank has a non-rectangular shape.

In accordance with another aspect of the present invention, there is provided a semiconductor memory device having a semiconductor memory chip divided into 18 regions having an equal area in a 3 rows×6 columns array, the semiconductor memory chip comprising: a first memory bank including memory blocks arranged at one region selected from a $2^{nd}$ row×$1^{st}$ column region, a $2^{nd}$ row×$2^{nd}$ column region and a $2^{nd}$ row×$3^{rd}$ column region and at a $1^{st}$ row×$1^{st}$ column region, a $1^{st}$ row×$2^{nd}$ column region and a $1^{st}$×$3^{rd}$ column region; a second memory bank including memory blocks arranged at one region selected from a $2^{nd}$ row×$1^{st}$ column region, a $2^{nd}$ row×$2^{nd}$ column region and a $2^{nd}$ row×$3^{rd}$ column region and at a $3^{rd}$ row×$1^{st}$ column region, a $3^{rd}$ row×$2^{nd}$ column region and a $3^{rd}$×$3^{rd}$ column region; a third memory bank including memory blocks arranged at one region selected from a $2^{nd}$ row×$4^{th}$ column region, a $2^{nd}$ row×$5^{th}$ column region and a $2^{nd}$ row×$6^{th}$ column region and at a $1^{st}$ row×$4^{th}$ column region, a $1^{st}$ row×$5^{th}$ column region and a $1^{st}$×$6^{th}$ column region; a fourth memory bank including memory blocks arranged at one region selected from a $2^{nd}$ row×$4^{th}$ column region, a $2^{nd}$ row×$5^{th}$ column region and a $2^{nd}$ row×$6^{th}$ column region and at a $3^{rd}$ row×$4^{th}$ column region, a $3^{rd}$ row×$5^{th}$ column region and a $3^{rd}$×$6^{th}$ column region; and pads and control blocks arranged at one region selected from the $2^{nd}$ row×$1^{st}$ column region, the $2^{nd}$ row×$2^{nd}$ column region, the $2^{nd}$ row×$3^{rd}$ column region, the 2$^{nd}$ row×4$^{th}$ column region, the 2$^{nd}$ row×5$^{th}$ column region and the 2$^{nd}$ row×6$^{th}$ column region.

In accordance with further another aspect of the present invention, there is provided a method for arranging memory blocks to a semiconductor memory chip in a semiconductor device, comprising of: configuring a plurality of memory blocks with a plurality of neighboring unit memory blocks; and configuring a plurality of memory banks with the neighboring memory blocks, wherein at least two memory blocks have different numbers of unit memory blocks each other in the same bank so that each memory bank has a non-rectangular shape.

BRIEF DESCRIPTION OF THE DRAWINGS

The above and other objects and features of the instant invention will become apparent from the following description of preferred embodiments taken in conjunction with the accompanying drawings, in which:

FIG. 3 is a plane view showing a 512-Mbit DDR SDRAM chip in accordance with the first embodiment of the present invention;

DETAILED DESCRIPTION OF THE INVENTION

Figure 1:
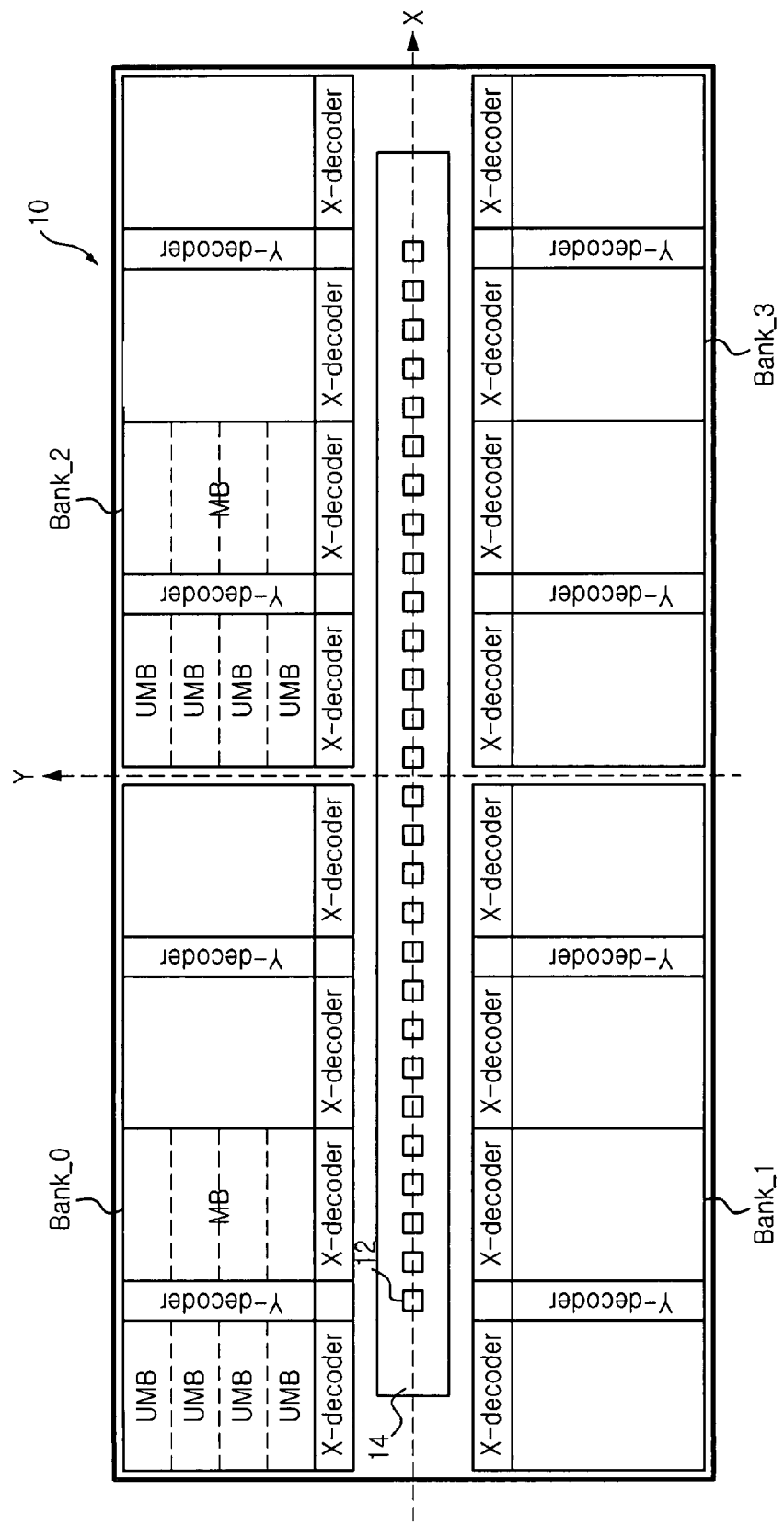
FIG. 1 is a plane view showing a typical memory bank array in the semiconductor memory chip.
Figure 2:
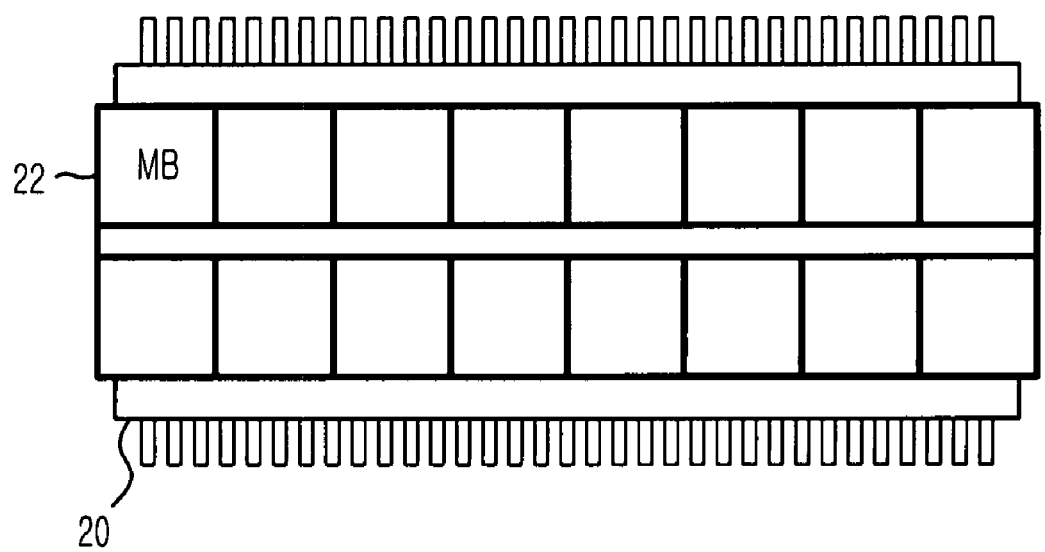
FIG. 2 is a schematic plane view showing a relation between a 512-Mbit semiconductor memory chip and a conventional package.

Hereinafter, a semiconductor memory device capable of packaging a semiconductor memory chip having an increased storage capacity in a conventional package in accordance with the present invention will be described in detail referring to the accompanying drawings.

For the sake of convenience, a 512-Mbit double data rate synchronous dynamic random access memory (DDR SDRAM) will be described as an example.

1) First Embodiment

FIG. 3 is a plane view showing the 512-Mbit DDR SDRAM (hereinafter, referred to as a semiconductor memory chip) in accordance with the first embodiment of the preset invention.

As shown, the semiconductor memory chip includes 12 memory blocks MB_0 to MB_11 and each memory block includes an X-decoder along an X-axis and a Y-decoder along a Y-axis for selecting one of memory cells contained in each memory block. Herein the Y-axis is typically shorter than the X-axis. Each of the memory banks includes three memory blocks MBs and the semiconductor memory chip includes four memory banks Bank_0, Bank_2 and Bank_3, which each memory bank can independently input and output data in one of the memory cells therein.

One of the memory banks Bank_0 includes three memory blocks MB_0 to MB_2. A first memory block MB_0 includes six unit memory blocks UMBs, which each unit memory block has 8-Mbit memory cells. Thus, the first memory block MB_0 corresponds to a 48-Mbit memory block. Second and third memory blocks MB_1 and MB_2 include five unit memory blocks, respectively, so that each of the second and third memory blocks MB_1 and MB_2 corresponds to a 40-Mbit memory block. Configurations of another three banks Bank_1, Bank_2 and Bank_3 are similar to that of the first bank Bank_0. Accordingly, each of the memory banks has a non-rectangular shape.

The X-decoder, which is in the 48-Mbit memory block, is formed between the fifth unit memory block and the sixth unit memory block in the successively formed six unit memory blocks to have a similar design with a neighboring 40-Mbit memory block. The X-decoder in the 48-Mbit memory block has two driving terminals (not shown in FIG. 3) in order to drive the 48-Mbit memory block by the X-decoder in the 48-Mbit memory block. One driving terminal is used to drive the 40-Mbit memory block having five unit memory blocks and another driving terminal is used to drive the remaining 8-Mbit unit memory block. The 48-Mbit memory block can be arranged at any memory block.

As shown in FIG. 3, the first bank Bank_0 is arranged on a second quadrant and the second bank Bank_1 is arranged on a third quadrant. The third bank Bank_2 is arranged on a first quadrant and the fourth bank Bank_3 is arranged on a fourth quadrant. The 48-Mbit memory blocks in the first and second banks Bank_0 and Bank_1 are arranged at a left-most region thereof and the 48-Mbit memory blocks in the third and the fourth banks Bank_2 and Bank_3 are arranged at a right-most region thereof.

As shown, there is no space to provide pads and a control block between the 48-Mbit memory blocks, e.g., MB_0 and MB_3 or MB_8 and MB_11, which are vertically adjacent to each other. Since there is enough space 30 between the 40-Mbit memory blocks, which are vertically opposite, the pads 120 and the control block 140 are arranged therebetween. Namely, the pads 120 and the control block 140 are horizontally arranged at a center region of the semiconductor memory chip. When an X-axis is divided by 6 regions, the pads 120 and the control block 140 are arranged at the center region, i.e., only from a second region to a fifth region.

Figure 4A:
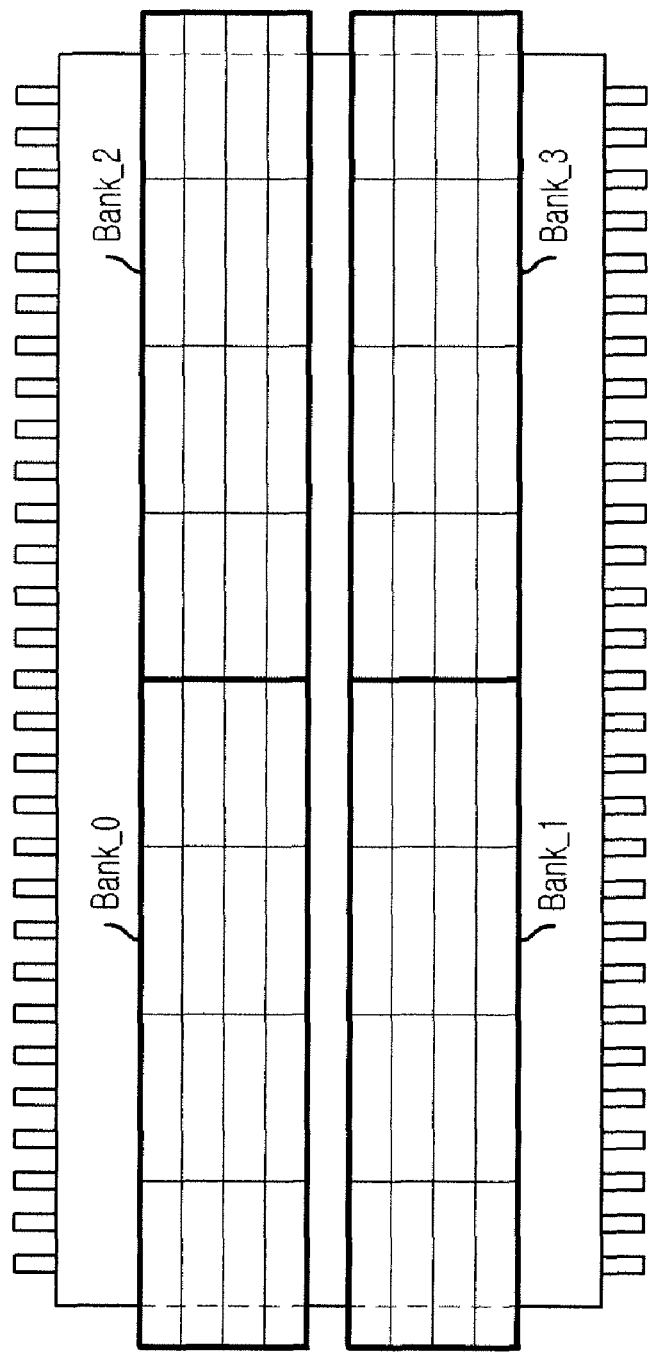
FIG. 4A is a schematic plane view showing a relation between a 512-Mbit semiconductor memory chip having a conventional bank array and a conventional package.
Figure 4B:
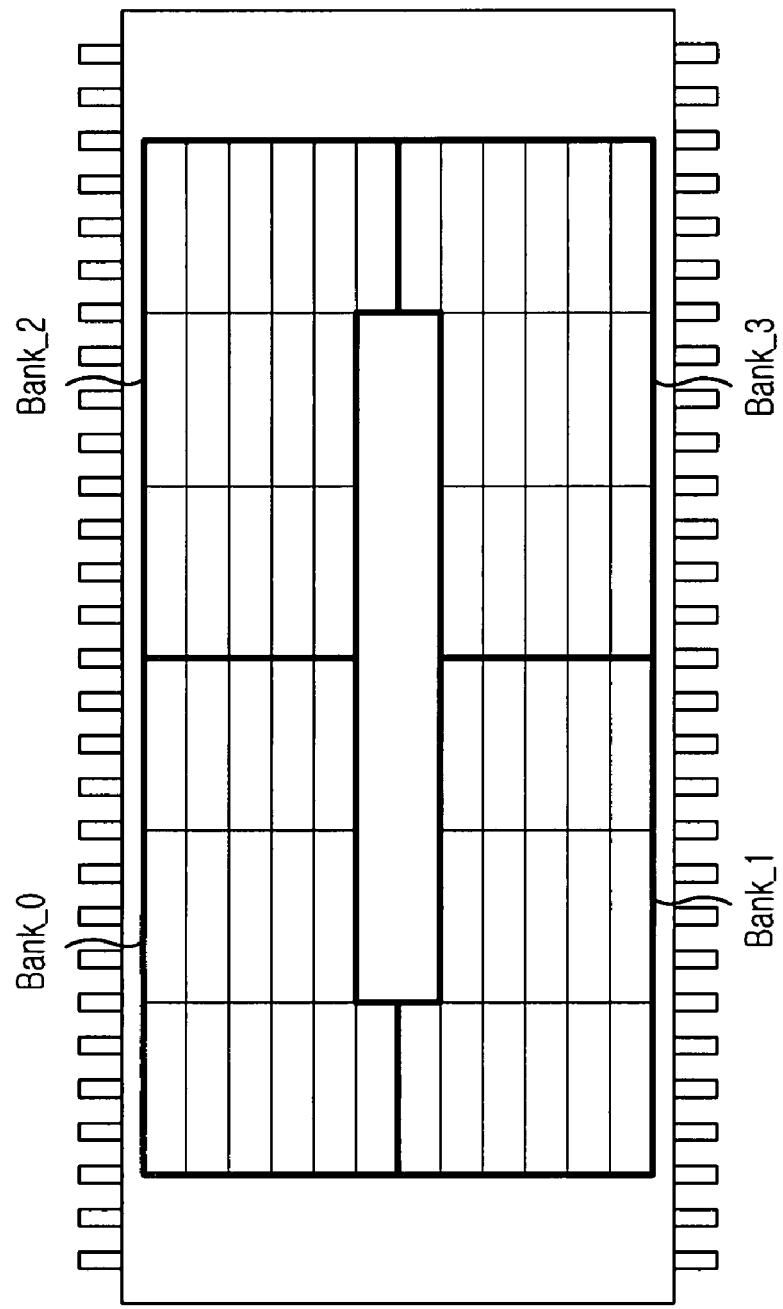
FIG. 4B is a schematic plane views showing a relation between a 512-Mbit semiconductor memory chip having a bank array in accordance with the present invention and a conventional package.

FIG. 4A is a schematic plane view showing a relation between a 512-Mbit semiconductor memory chip having a conventional bank array and a conventional package, and FIG. 4B is a schematic plane view showing a relation between a 512-Mbit semiconductor memory chip having a bank array in accordance with the present invention and a conventional package.

As shown, when the same design rule is applied, the first embodiment of present invention satisfies the conventional package size, however, as shown in FIG. 4A, the prior art does not satisfy the package size.

Figure 5A:
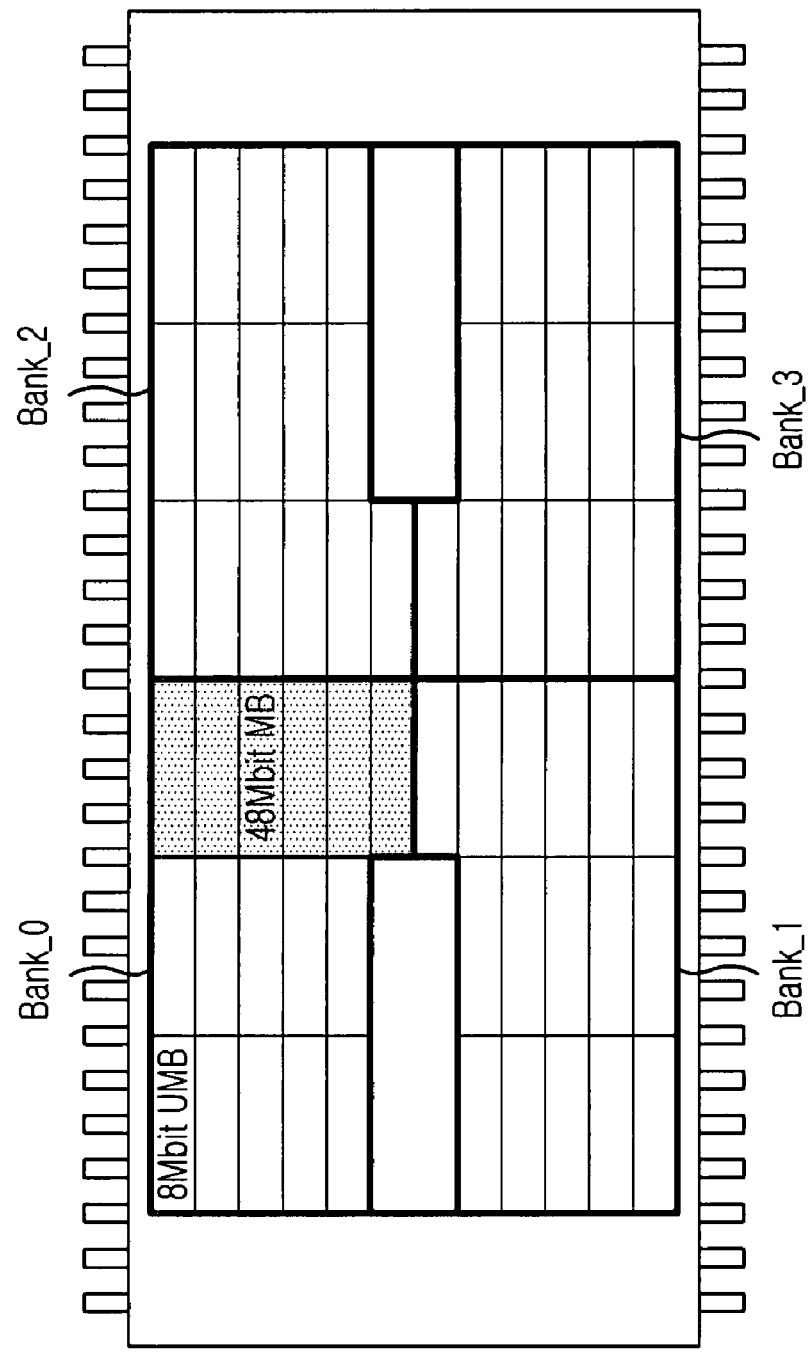
FIGS. 5A and 5B are schematic plane views showing relations between the semiconductor memory chip and the package by changing positions of the 48-Mbit memory block and the control block in the first embodiment of the present invention.
Figure 5B:
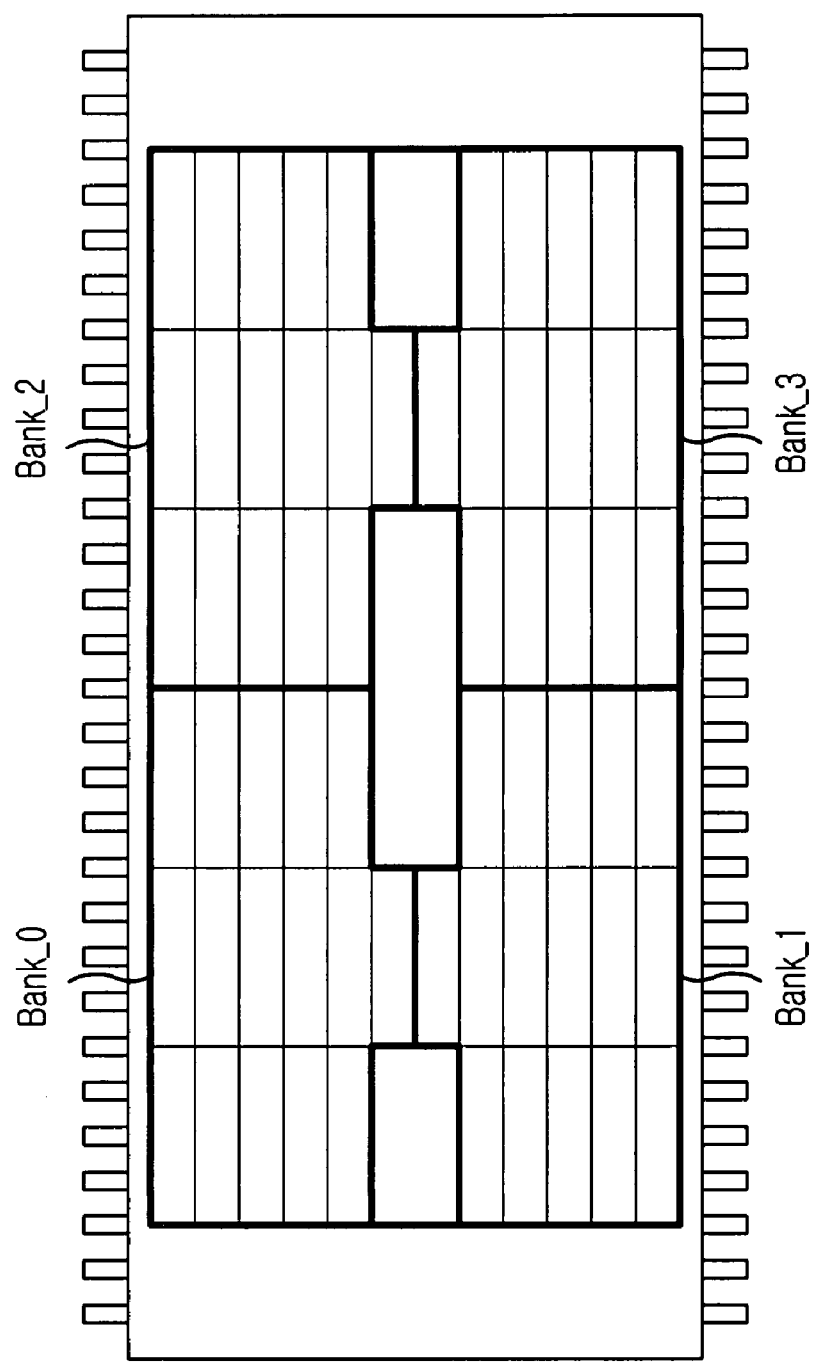

FIGS. 5A and 5B are schematic plane views showing relations between the semiconductor memory chip and the package by changing positions of the 48-Mbit memory block and the control block in the first embodiment of the present invention. FIG. 5A shows that each 48-Mbit memory block in each memory bank is arranged at a center of the semiconductor memory chip and FIG. 5B shows that the 48-Mbit memory blocks are arranged between each 40-Mbit memory blocks in each memory bank. Herein, even if the pads 120 and the control block 140 are arranged by being divided to 2 or 3 regions, FIGS. 5A and 5B show that the semiconductor memory chips meet the conventional package size. Also, compared with the prior art, the number of chips to be obtained per one wafer is increased in accordance with the present invention because the ratio of X-axis length to Y-axis length is decreased.

2) Second Embodiment

Figure 6:
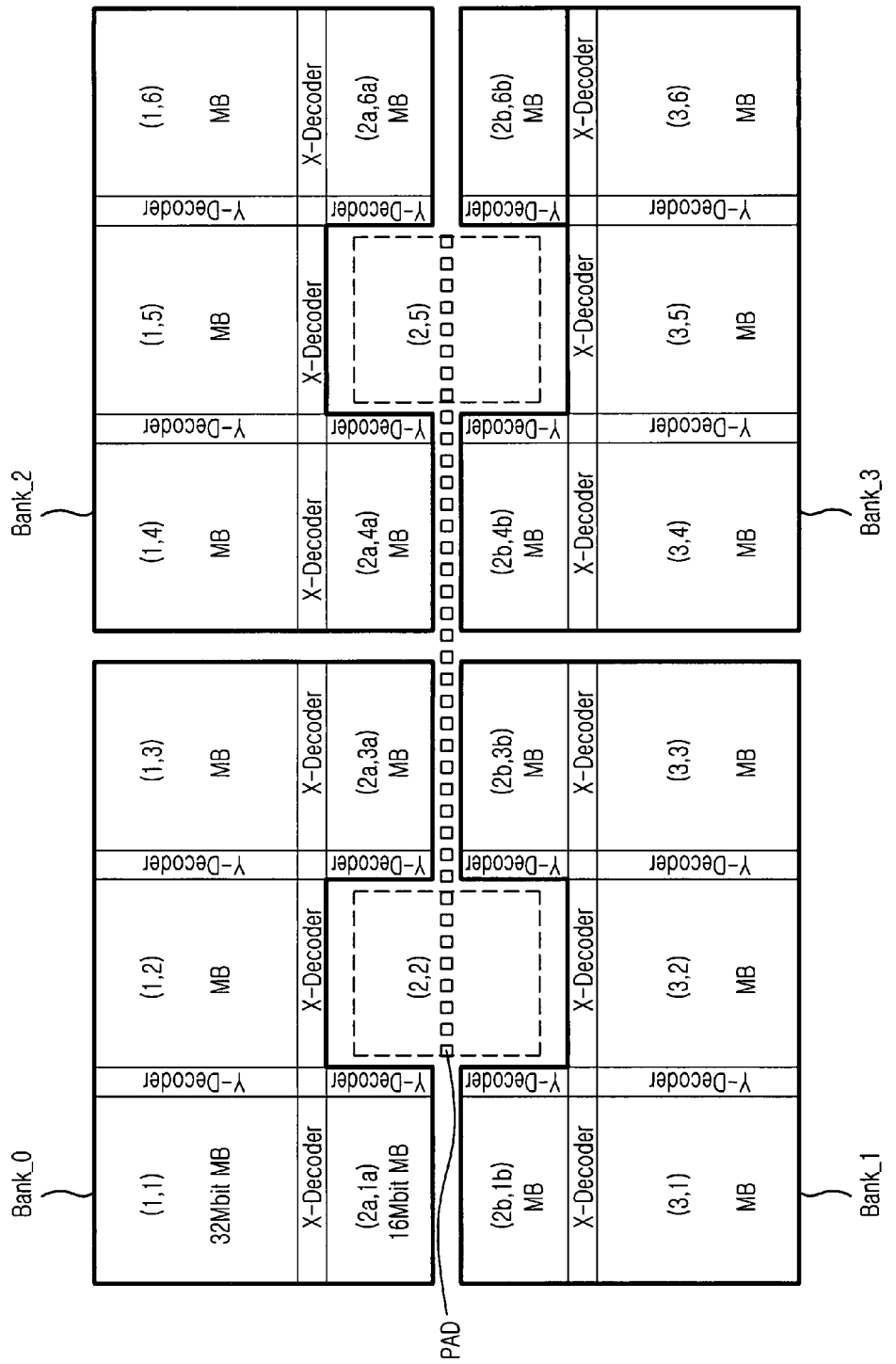
FIG. 6 is a plane view showing a semiconductor memory chip, e.g., a 512-Mbit DDR SDRAM, in accordance with the second embodiment of the present invention.

FIG. 6 is a plane view showing a semiconductor memory chip, e.g., a 512-Mbit DDR SDRAM, in accordance with the second embodiment of the present invention.

As shown, the semiconductor memory chip is vertically divided into 3 regions and horizontally divided into 6 regions. That is, the semiconductor memory chip is divided to a 3×6 block array having 18 regions. Herein, a length of a horizontal axis (hereinafter, referred to as an X-axis) of the semiconductor memory chip is longer than that of a vertical axis (Hereinafter, referred to as a Y-axis) thereof.

In middle regions of the Y-axis, a (2,1) region, which corresponds to a region of a second row and a first column in the 18 regions, is divided to two regions, (2a,1a) and (2b,1b). Also, a region (2,3), which corresponds to the second row and the third column, is divided into two regions, (2a,3a) and (2b,3b). The divided upper regions (2a,1a) and (2a,3a) are included in a first bank Bank_0 together with (1,1), (1,2) and (1,3) regions. The divided lower regions (2b,1b) and (2b, 3b) are included in a second bank Bank_1 together with (3,1), (3,2) and (3,3) regions. Accordingly, the first and second bank Bank_0 and Bank_1 have a non-rectangular shape different from that of the prior art. A first control block is arranged at a (2,2) region to control the first and second memory banks.

A third bank Bank_2 and a fourth bank Bank_3 have the same configuration with the first and second banks Bank_0 and Bank_1. In middle regions, a (2,4) region is divided to two regions, (2a,4a) and (2b, 4b), and a region (2,6) is divided to two regions, (2a,6a) and (2b,6b). The divided upper regions (2a,4a) and (2a,6a) are included in the third bank Bank_2 together with (1,4), (1,5) and (1,6) regions. The divided lower regions (2b,4b) and (2b, 6b) are included in the fourth bank Bank_3 together with (3,4), (3,5) and (3,6) regions. Accordingly, the third and fourth banks Bank_2 and Bank_3 have a non-rectangular shape different from that of the prior art. A plurality of pads are arranged between the first bank Bank_0 and the second bank Bank_1 and between the third bank Bank_2 and the fourth bank Bank_3. Also, a second control block is arranged at a (2,5) region to control the third and fourth memory banks, Bank_2 and Bank_3.

The first memory bank Bank_0 includes a first memory block of 48 Mbits arranged in the regions (1,1) and (2a,1a), a second memory block of 32 Mbits arranged in the region (1, 2), and a third memory block of 48 Mbits arranged in the regions (1,3) and (2a,3a). In the first memory block, four unit memory blocks, which one of unit memory blocks corresponds to 8-Mbit memory block, are arranged in the region (1,1) and two unit memory block is arranged in the region (2a,1a).

Since the configuration of the second to fourth memory banks Bank_1 to Bank_3 is similar to that of the first memory bank, a detailed description of the configuration thereof will be omitted.

Since each memory bank includes two 48-Mbit memory blocks and one 32-Mbit memory block, each memory bank has a non-rectangular shape. And, the second embodiment of the present invention satisfies a conventional package size without developing an improved design rule.

Figure 7:
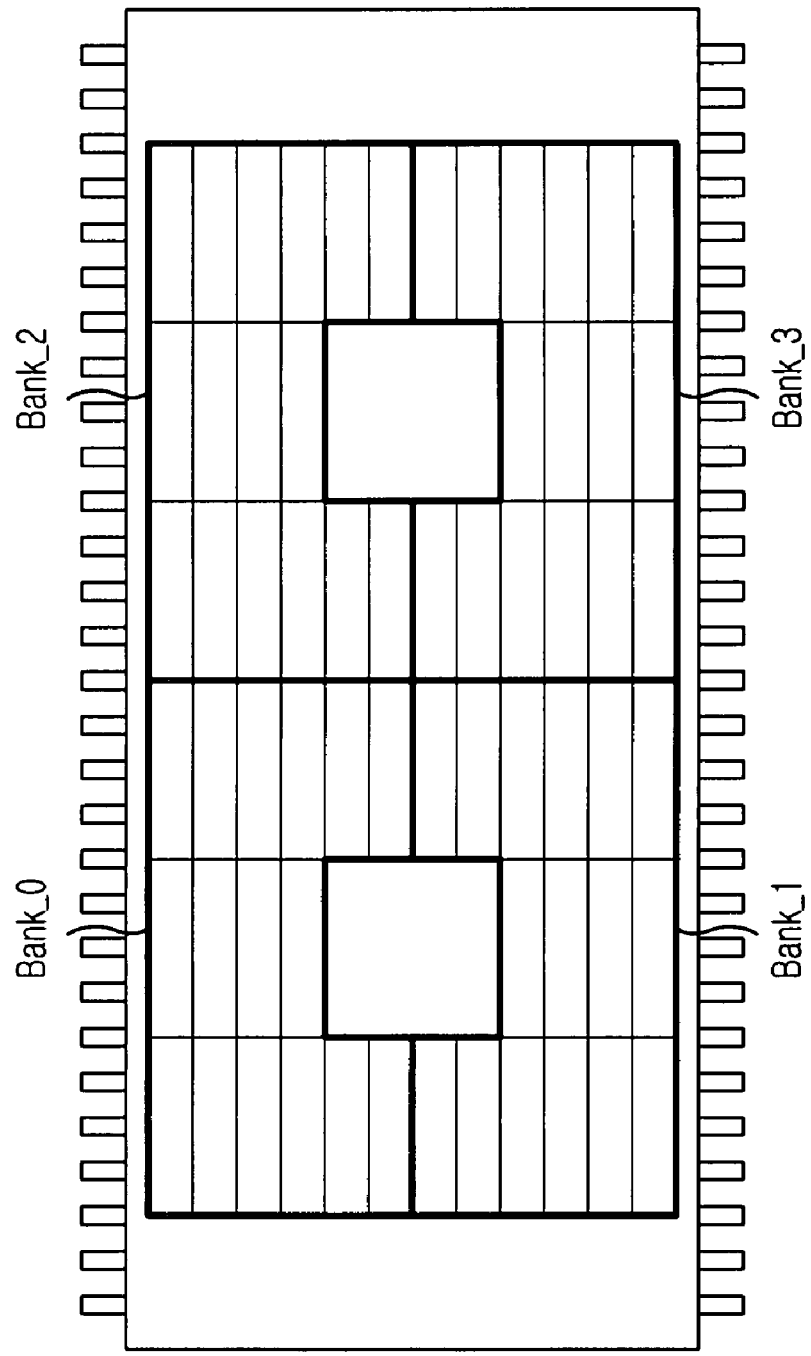
FIG. 7 is a schematic plane view showing a relation between a semiconductor memory chip and a conventional package satisfying a conventional package size in accordance with the second embodiment of the present invention.

FIG. 7 is a schematic plane view showing a relation between the semiconductor memory chip and the conventional package satisfying a conventional package size in accordance with the second embodiment of the present invention even if the same design rule with the prior art applied. Also, the number of semiconductor memory chips to be obtained per one wafer can be increased because a ratio of X-axis to Y-axis is decreased.

Each memory block includes a pair of an X-decoder and a Y-decoder. The X-decoder, which is in the 48-Mbit memory block, is formed between the fourth unit memory block and the fifth unit memory block in the successively formed six unit memory blocks to have a similar design with a neighboring 32-Mbit memory block. In order to drive the 48-Mbit memory block with the X-decoder in the 48-Mbit memory block, the X-decoder has two driving terminals (not shown). One driving terminal is used to drive the 32-Mbit memory block having four unit memory blocks and another driving terminal is used to drive the remaining 16-Mbit memory block.

Each memory block includes a pair of an X-decoder and a Y-decoder. The X-decoder, which is in the 48-Mbit memory block, is formed between the fourth unit memory block and the fifth unit memory block in the successively formed six unit memory blocks to have a similar design with a neighboring 32-Mbit memory block. In order to drive the 48-Mbit memory block with the X-decoder in the 48-Mbit memory block, the X-decoder has two driving terminals (not shown). One driving terminal is used to drives the 32-Mbit memory block having four unit memory blocks and another driving terminal is used to drives the remaining 16-Mbit memory block.

A plurality of pads PAD are arranged between the first memory bank Bank_0 and the second memory bank Bank_1, and between the third memory bank Bank_2 and the fourth memory bank Bank_3, by being taken along the X-axis.

Figure 8A:
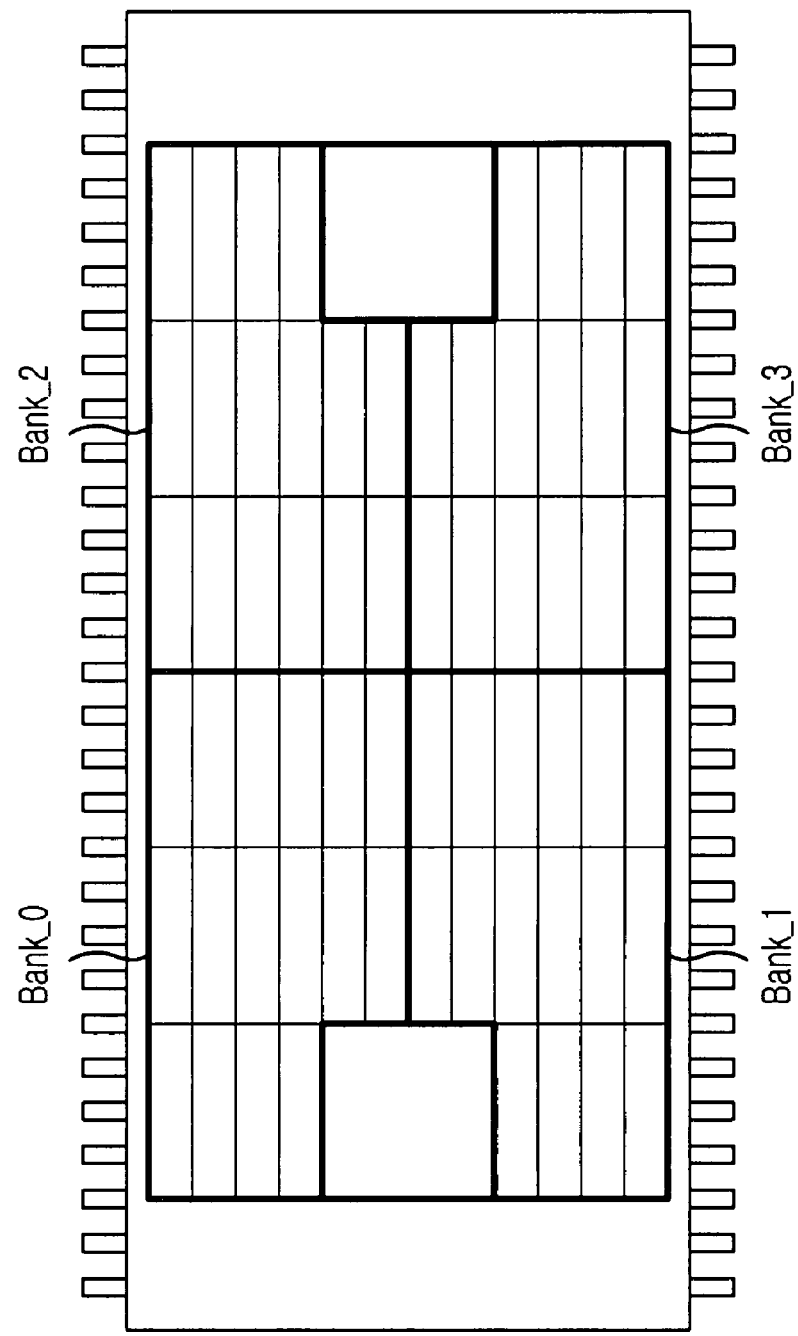
FIGS. 8A and 8B are schematic plane view showing relations between the semiconductor memory chip and the package by changing positions of the control blocks in FIG. 7.
Figure 8B:
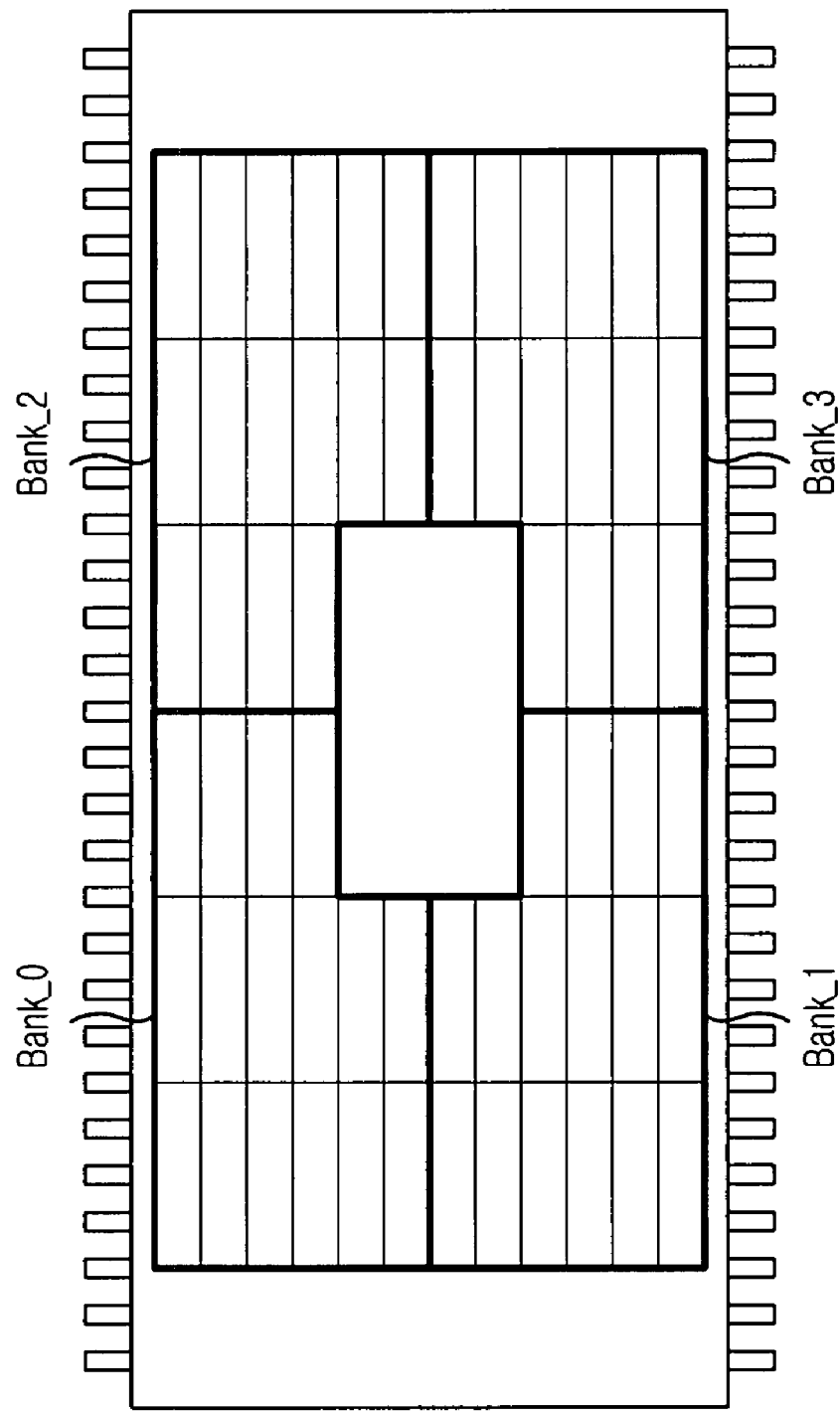

FIGS. 8A and 8B are schematic plane view showing relations between the semiconductor memory chip and the package by changing positions of the control blocks in FIG. 7. The first control block is arranged at a (2,1) region and the second control block is arranged at a (2,6) region as shown in FIG. 8A and the first control block and the second control block are arranged at (2,3) and (2,4) regions in FIG. 8B different from that of FIG. 7.

Also, the first to fourth memory banks Bank_0 to Bank_1 in the FIGS. 8A and 8B have a non-rectangular shape and meet a conventional package size.

3) Third Embodiment

Figure 9:
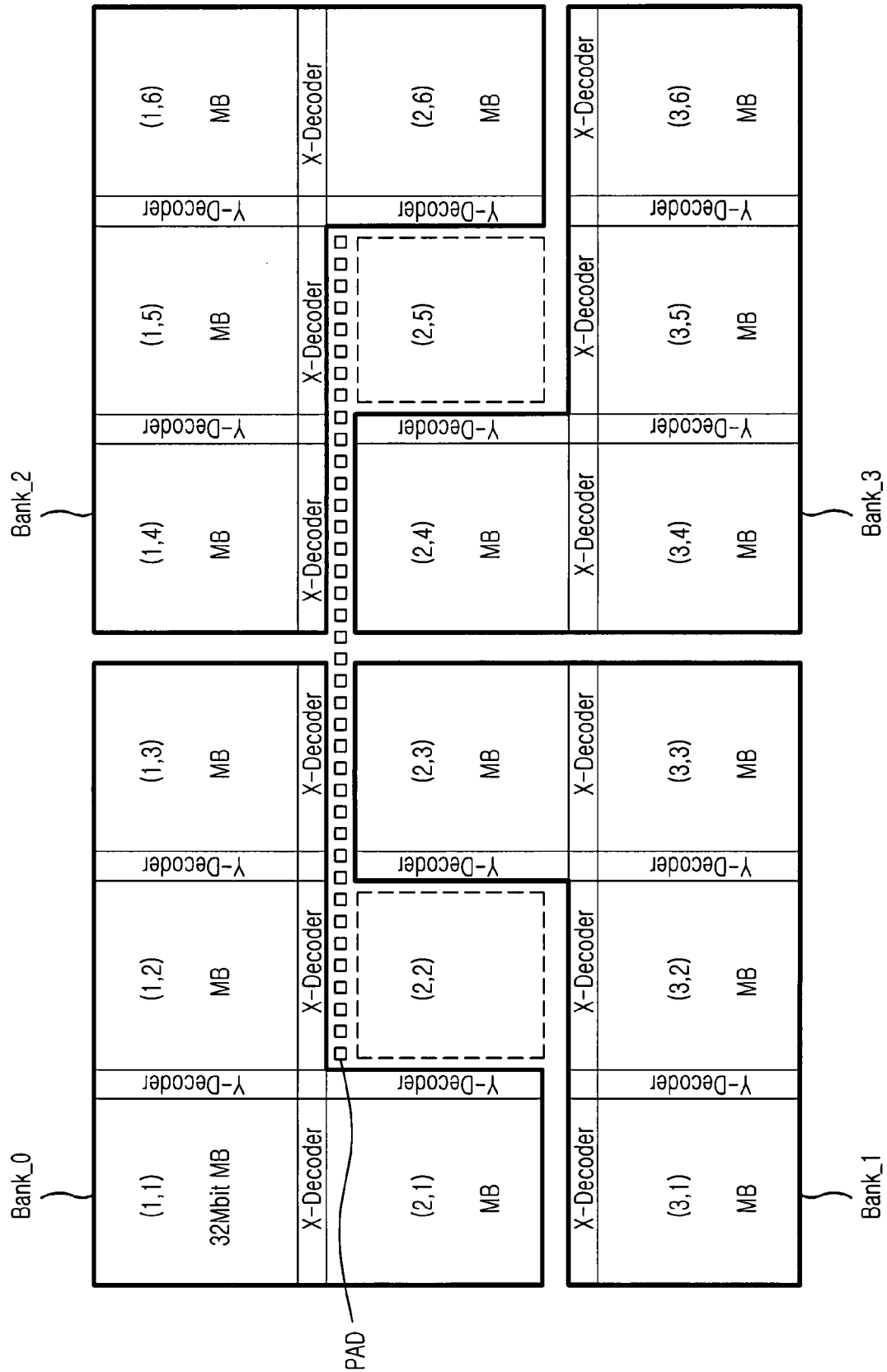
FIG. 9 is a plane view illustrating a 512-Mbit DDR SDRAM chip in accordance with a third embodiment of the present invention.

FIG. 9 is a plane view illustrating a 512-Mbit DDR SDRAM chip in accordance with a third embodiment of the present invention.

As shown, the semiconductor memory chip is vertically divided by 3 and horizontally divided by 6. That is, the semiconductor memory chip is equally divided to a 3×6 block array having 18 regions. Herein, a length of a horizontal axis (hereinafter, referred to as an X-axis) of the semiconductor memory chip is longer than that of a vertical axis (Hereinafter, referred to as a Y-axis) thereof. Each memory block is arranged at 16 regions and one bank consists of four memory blocks, which are adjacent each other. First and second control blocks are arranged at another two regions.

Four 32-Mbit memory blocks, each having four 8-Mbit unit memory blocks, are arranged at (1,1), (1,2), (1,3) and (2,1) regions, respectively, in a first bank Bank_0. Even though each 32-Mbit memory block has a rectangular shape, the first bank Bank_0 consisting of four memory blocks has a non-rectangular shape different from that of the conventional bank.

Four 32-Mbit memory blocks are arranged at (2,3), (3,1), (3,2) and (3,3) regions, respectively, in a second bank Bank_1. Even though each 32-Mbit memory block has a rectangular shape, the second bank Bank_1 consisting of four memory blocks has also a non-rectangular shape different from that of the conventional bank. The first control block is arranged at a (2,2) region surrounded by the first bank Bank_0 and the second bank Bank_1.

The third memory bank Bank_2 and the fourth memory bank Bank_3 are similarly arranged with the first and the second memory bank Bank_0 and Bank_1. The second control block is arranged at a (2,5) region surrounded by the third bank Bank_2 and the fourth bank Bank_3.

And, each memory block includes a pair of an X-decoder along the X-axis and a Y-decoder along the Y-axis. The vertically adjacent 32-Mbit memory blocks, which belong to the same bank, share the X-decoder with each other.

A plurality of pads are arranged between the fist bank Bank_0 and the second bank Bank_1 and between the third bank Bank_2 and the fourth bank Bank_3 by being taken along the center of the semiconductor memory chip.

Namely, one bank consists of four 32-Mbit memory blocks and a shape thereof has a non-rectangular shape.

Figure 10:
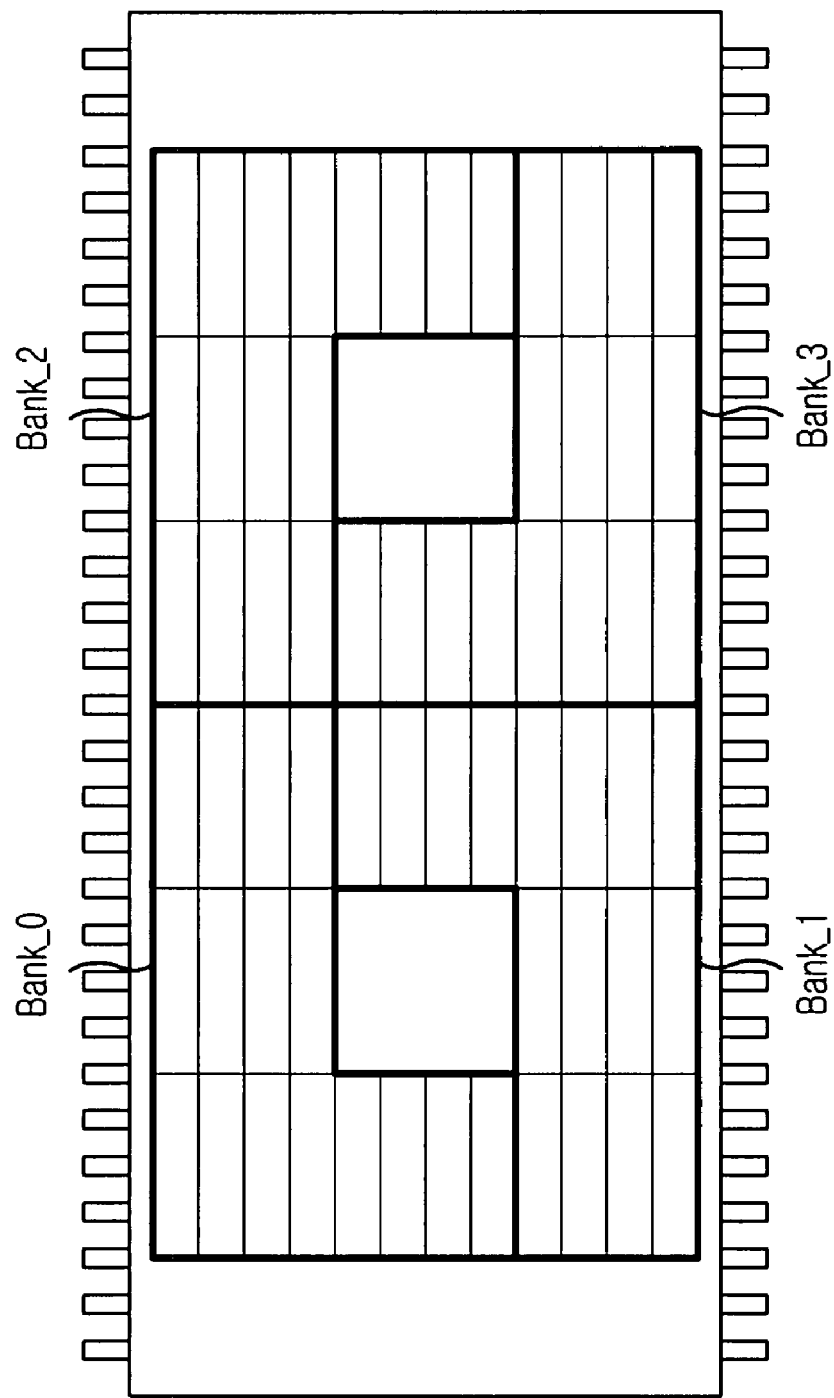
FIG. 10 is a schematic plane view showing a relation between the semiconductor memory chip in FIG. 9 and a conventional package.

FIG. 10 is a schematic plane view showing the semiconductor memory chip in FIG. 9 and a conventional package, satisfying a conventional package size in accordance with the third embodiment of the present invention.

Figure 11A:
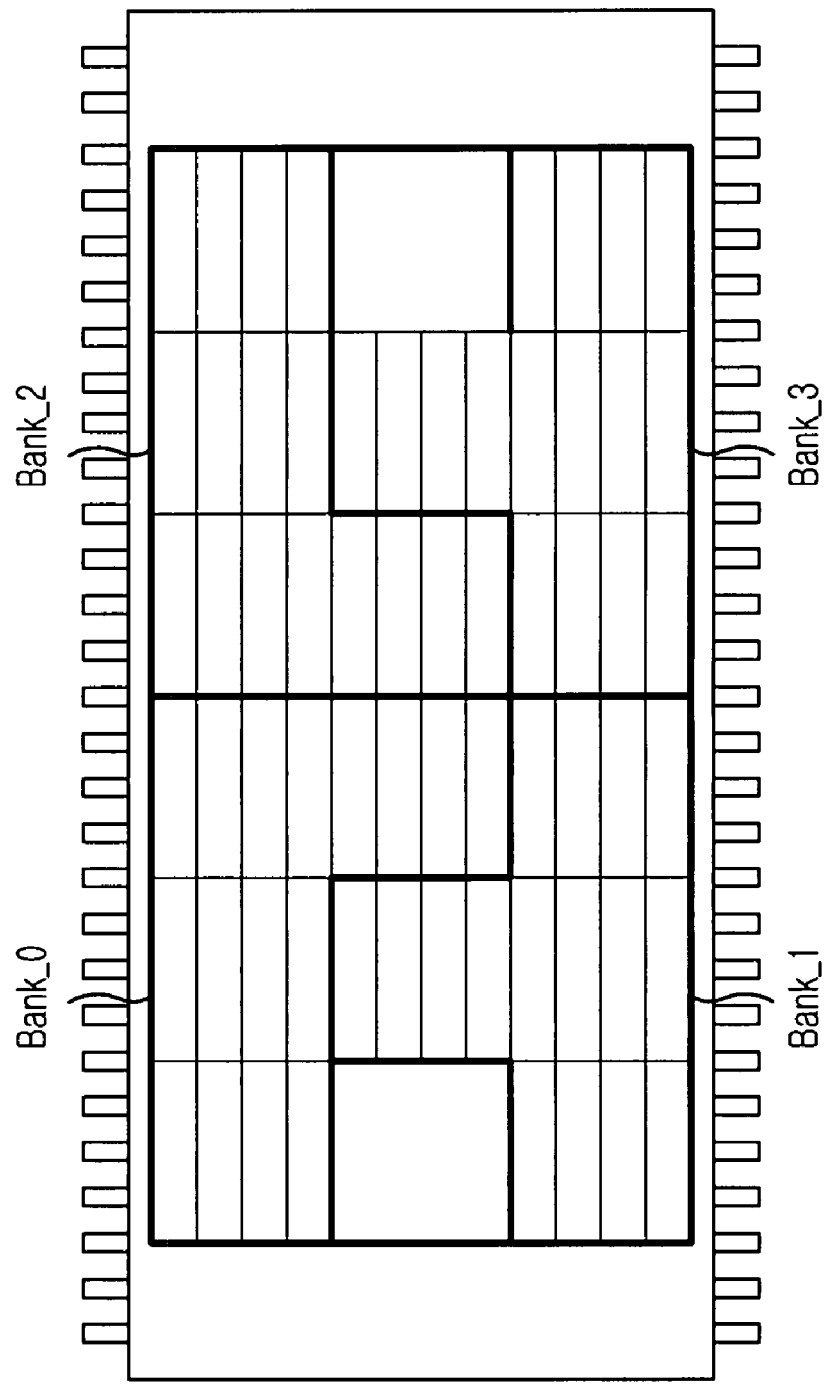
FIGS. 11A and 11B are schematic plane views showing relations between the semiconductor memory chip and the package by changing positions of the first and second control blocks in accordance with the third embodiment of the present invention.
Figure 11B:
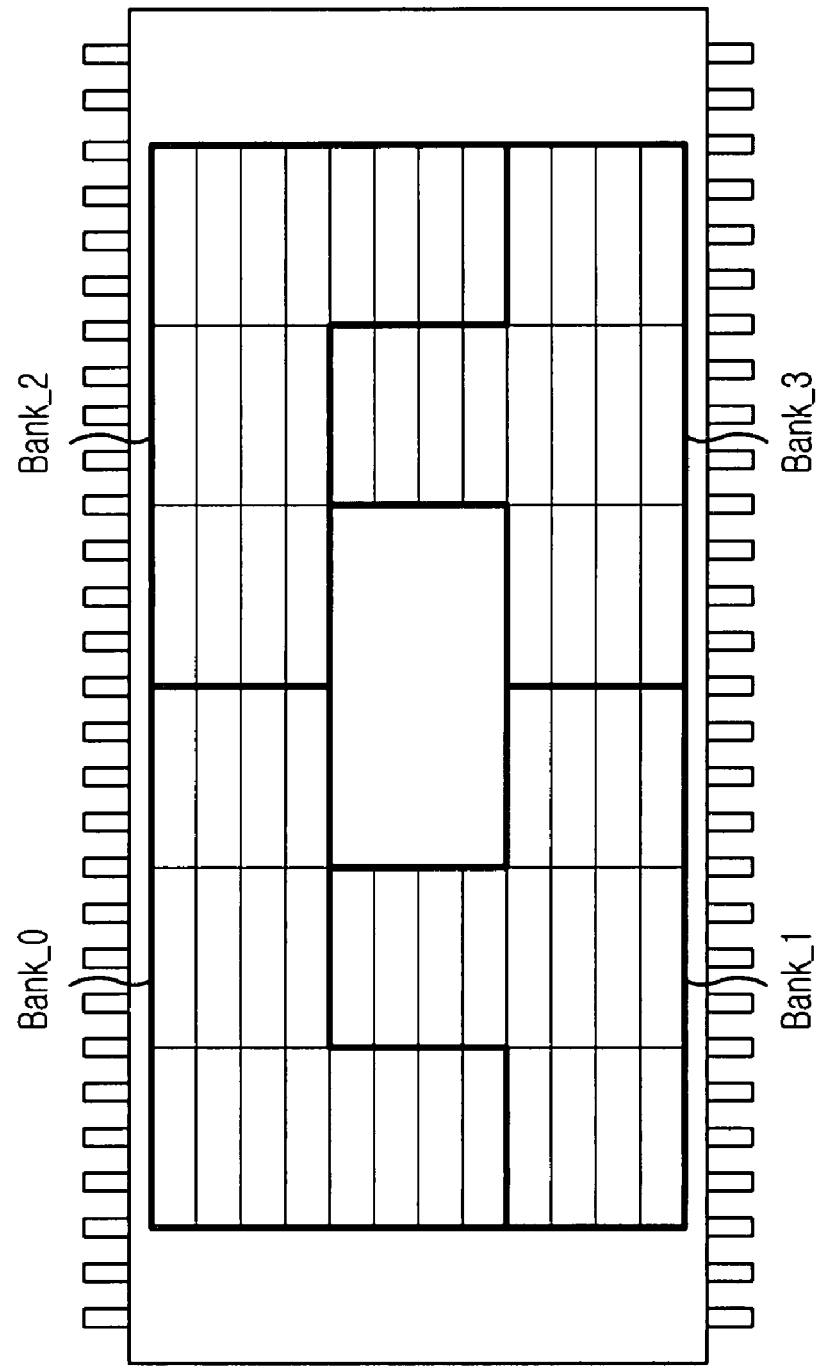

FIGS. 11A and 11B are schematic plane views showing relations between the semiconductor memory chip and the package by changing positions of the first and second control blocks in accordance with the third embodiment of the present invention.

As shown in FIG. 11A, the first control block is arranged at a (2,1) region and the second control block is arranged at a (2,6) region different from the array in FIG. 9. Also, the first control block may be arranged at a (2,3) region and the second control block is arranged at a (2,4) region as shown in FIG. 11B. In accordance with the third embodiment of the present invention, the memory banks Bank_0 to Bank_3 have a non-rectangular shape and the semiconductor memory chip meets a conventional package size, so that there is no need to expand the X-axis of the package for the semiconductor memory chip having an increased storage capacity when the same rule is applied.

As the memory bank is fabricated with a non-rectangular shape instead of a regulated rectangular shape, a semiconductor memory chip having an increased storage capacity can satisfy the conventional package size. Therefore, a semiconductor memory chip of a high efficiency with a low cost can be fabricated.

Hereinafter, an array of a plurality of pads, power wires and data wires to be applied in the structure mentioned above will be described.

Figure 12:
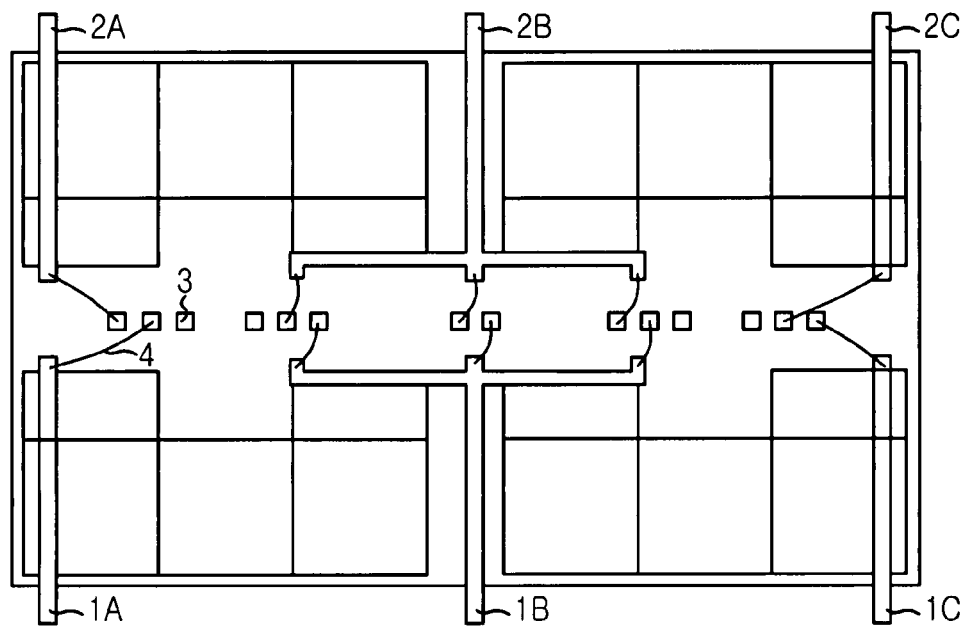
FIG. 12 is a schematic plane view showing interconnection between power lead frames and pads to be wire-bonded to each other in accordance with the second embodiment of the present invention shown in FIG. 6.

FIG. 12 is a schematic plane view showing interconnection between power lead frames and pads to be wire-boned each other in accordance with the second embodiment of the present invention shown in FIG. 6.

Reference symbols 1a, 1b and 1c represent the lead frames for VSS, and reference symbols 2a, 2b and 2c represent the lead frames for VDD. Also, a reference symbol 3 represents a pad and a reference symbol 4 represents a wire.

Generally, a SDRAM has package pins of three pairs of VDD and VSS. As shown in FIG. 12, the power lead frames are configured at left and right sides and a middle portion of the semiconductor memory chip. And, the lead frames 1b and 2b positioned at the middle portion of the semiconductor memory chip is formed to be wire-bonded with three pairs of VDD and VSS by bi-directionally expanding the lead frame to the X-axis. In FIG. 6, there is no need to form a power bus for the lead frame between the regions (2a,3a) and (2b,3b), and between the regions (2a,4a) and (2b,4b). Also, the above lead frame can be applied to the embodiments of FIGS. 3 and 9.

The power wires configured in a wafer level of the chip is structured in a plane mesh type over the memory blocks of the chip. If the power wires or signal wires are configured between output wires of the Y-decoder, the power wires or the signal wires can be connected with between the first control block and the second control block. Therefore, there is no need to form the power wires or the signal wires between the regions (2a,3a) and (2b,3b), and between the regions (2a,4a) and (2b,4b), so that a space occupied by the pads and the control blocks can be reduced.

Figure 13:
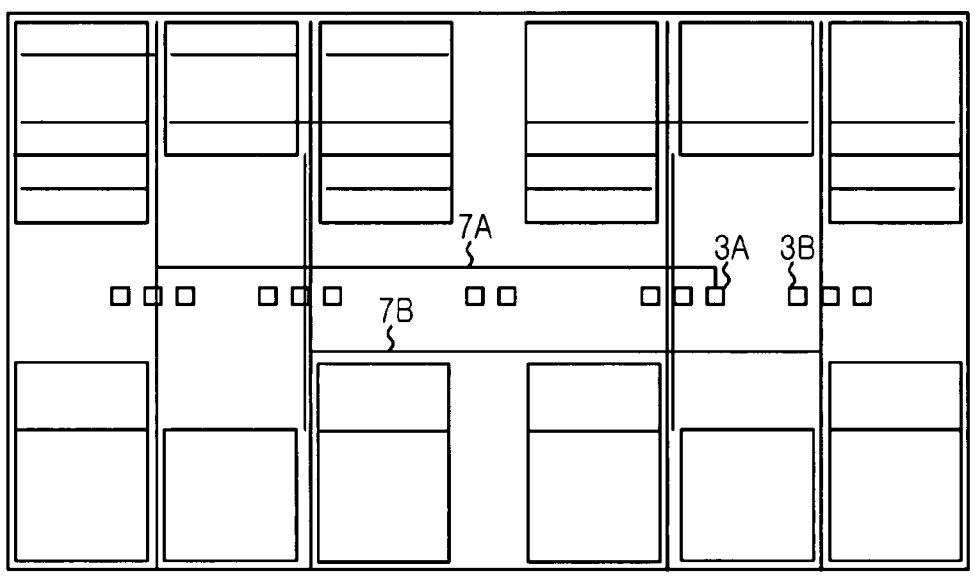
FIG. 13 is a plane view showing a configuration of data wires in accordance with the second embodiment of the present invention shown in FIG. 6.

FIG. 13 is a plane view showing a configuration of data wires in accordance with the second embodiment of the present invention shown in FIG. 6.

Generally, the data wire of a memory array is connected to a sense amplifier in the Y-decoder. The data wires for each memory bank are joined to a global data wire. At this time, in order to reduce a data delay due to the wire, a left data wire 7a of each memory bank is connected to a left data pad 3a and a right data wire 7b of each memory bank is connected to a right data pad 3b as shown in FIG. 13.

Since the semiconductor memory chip has memory banks of a non-rectangular shape with plane, a semiconductor memory device having an increased storage capacity can be applied to the conventional package without developing an improved design rule. Namely, the semiconductor memory chip can be provided with a low cost.

Also, since there is no need to expand the package size, i.e., especially the X-axis, in order to obtain a semiconductor memory chip of a high storage capacity, there is an effect of reducing a ratio between the X-axis and the Y-axis of the semiconductor memory chip. Therefore, the number of chips to be obtained per wafer is increased.

Furthermore, since the number of X-decoders for each memory bank can be reduced, an area occupied by the X-decoders can be reduced.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
   a plurality of memory banks capable of independently being accessed, each memory bank having a plurality of memory blocks, wherein each memory bank has a non-rectangular shape; and
   a plurality of pads and control blocks arranged in a vacant space formed between neighboring memory banks,
   wherein at least two of the plurality of memory blocks, which are adjacent each other in the same memory bank, have different numbers of unit memory blocks, and wherein the non-rectangular shapes of the plurality of memory banks are arranged to be symmetric about a longitudinal axis of a semiconductor chip passing between the plurality of memory banks, or about a latitudinal axis of the semiconductor chip passing between the plurality of the memory banks.

2. The semiconductor memory device as recited in claim 1, wherein each of the plurality of memory blocks includes a pair of X-decoder and Y-decoder capable of accessing one or more unit memory blocks within a memory block.

3. The semiconductor memory device as recited in claim 1, wherein a total memory region of the semiconductor memory chip is divided into four memory banks, wherein the four memory banks are arranged in the first, second, third and fourth quadrants of the semiconductor chip, respectively.

4. The semiconductor memory device as recited in claim 3, wherein each memory bank includes:
   a first memory block having a first number of the unit memory blocks;
   a second memory block having a second number of the unit memory blocks, which is smaller than that of the first memory blocks; and
   a third memory block having the second number of unit memory blocks.

5. The semiconductor memory device as recited in claim 4, wherein the first memory blocks of memory banks arranged in the second and third quadrants are arranged at a left-most region of the semiconductor memory chip and the first memory block of banks arranged in the first and fourth quadrants is arranged at a right-most region of the semiconductor memory chip.

6. The semiconductor memory device as recited in claim 1, wherein the entire outer shape of the plurality of banks including the plurality of pads and control blocks is a rectangular shape.

7. The semiconductor memory device as recited in claim 1, wherein the plurality of memory blocks comprises a first memory block having a first number of unit memory blocks and a second memory block having a second number of unit memory blocks less than the first number of unit memory blocks; and
   wherein the vacant space is formed corresponding to a difference region between the first memory block and the second memory block.

8. The semiconductor memory device as recited in claim 1, wherein the non-rectangular shapes of the plurality of memory banks are arranged to be symmetric about a longitudinal axis of the semiconductor chip passing between the plurality of memory banks, and about a latitudinal axis of the semiconductor chip passing between the plurality of the memory banks.

9. The semiconductor memory device as recited in claim 1, wherein one half of the plurality of memory banks is located on a first side of the longitudinal axis, and one half of the plurality of memory banks is located on a second side of the longitudinal axis, opposite the first side.

10. The semiconductor memory device as recited in claim 9, wherein one half of the plurality of memory banks is located on a first side of the latitudinal axis, and one half of the plurality of memory banks is located on a second side of the latitudinal axis, opposite the first side.

* * * * *